US009257600B2

(12) United States Patent
Tang et al.

(10) Patent No.: US 9,257,600 B2
(45) Date of Patent: Feb. 9, 2016

(54) WHITE LIGHT QUANTUM DOT COMPLEX PARTICLE AND PROCESS FOR PREPARING SAME

(71) Applicant: BOE TECHNOLOGY GROUP CO., LTD., Beijing (CN)

(72) Inventors: Chen Tang, Beijing (CN); Jingxia Gu, Beijing (CN); Xuelan Wang, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 14/368,159

(22) PCT Filed: Nov. 14, 2013

(86) PCT No.: PCT/CN2013/087165
§ 371 (c)(1),
(2) Date: Jun. 23, 2014

(87) PCT Pub. No.: WO2015/021699
PCT Pub. Date: Feb. 19, 2015

(65) Prior Publication Data
US 2015/0083991 A1 Mar. 26, 2015

(30) Foreign Application Priority Data

Aug. 16, 2013 (CN) .......................... 2013 1 0359549

(51) Int. Cl.
*H01L 29/06* (2006.01)
*H01L 33/06* (2010.01)
(Continued)

(52) U.S. Cl.
CPC .............. *H01L 33/06* (2013.01); *C09K 11/025* (2013.01); *C09K 11/883* (2013.01); *H01L 33/0083* (2013.01); *H01L 33/08* (2013.01); *Y02B 20/181* (2013.01)

(58) Field of Classification Search
CPC ..... H01L 33/0083; H01L 33/06; H01L 33/08; C09K 11/025; C09K 11/883
USPC .......................................................... 257/13
See application file for complete search history.

(56) References Cited

U.S. PATENT DOCUMENTS

| 8,414,800 B2* | 4/2013 | Jang ....................... B82Y 30/00 252/500 |
| 2005/0287691 A1* | 12/2005 | Chen ...................... B82Y 10/00 438/29 |

(Continued)

FOREIGN PATENT DOCUMENTS

| CN | 101049631 A | 10/2007 |
| CN | 102344632 A | 2/2012 |

(Continued)

OTHER PUBLICATIONS

Chinese Office Action of Chinese Application No. 201310359549.5 with English translation, mailed Jul. 3, 2014.
International Search Report, International Preliminary Report on Patentability and Written Opinion of the International Searching Authority of PCT/CN2013/087165 in Chinese, mailed Nov. 14, 2013.

(Continued)

*Primary Examiner* — Matthew Gordon
(74) *Attorney, Agent, or Firm* — Collard & Roe, P.C.

(57) ABSTRACT

A white light quantum dot complex particle, comprising a seed particle (1) in the core, and a first shell layer (2), a second shell layer (3) and a third shell layer (4) wrapped around the seed particle (1) in order; in the first shell layer (2), the second shell layer (3) and the third shell layer (4) are one of a red light quantum dot layer, a green light quantum dot layer and a blue light quantum dot layer respectively, and are different from one another. Also disclosed is the process for preparing the white light quantum dot complex particle.

19 Claims, 1 Drawing Sheet

(51) Int. Cl.
- *H01L 33/00* (2010.01)
- *H01L 33/08* (2010.01)
- *C09K 11/02* (2006.01)
- *C09K 11/88* (2006.01)

(56) References Cited

U.S. PATENT DOCUMENTS

| | | | | |
|---|---|---|---|---|
| 2008/0012031 A1* | 1/2008 | Jang | ............ | C09K 11/02 257/89 |
| 2010/0140586 A1* | 6/2010 | Char | ............ | B82Y 10/00 257/14 |
| 2010/0308271 A1* | 12/2010 | Bartel | ............ | C09K 11/883 252/301.6 R |
| 2014/0061503 A1* | 3/2014 | Lee | ............ | C09K 11/02 250/458.1 |

FOREIGN PATENT DOCUMENTS

| | | |
|---|---|---|
| CN | 102618289 A | 8/2012 |
| CN | 102925158 A | 2/2013 |
| WO | 2013/065956 A1 | 5/2013 |

OTHER PUBLICATIONS

English translation of the Written Opinion of the International Searching Authority for PCT/CN2013/087165, mailed Mar. 13, 2014 (Chinese Written Opinion was previously submitted on Jun. 23, 2014).

Sameer Sapra, Sergiy Mayilo, Thomas A. Klar, Andrey L. Roglach, and Jochen Feldman, "Bright White-Light Emission from Semiconductor Nanocrystals: by Chance and by Design" in Advanced Materials, article first published on line Jan. 24, 2007, vol. 19, Issue 4, pp. 569-572.

English translation of the Search Report of the International Searching Authority for PCT/CN2013/087165, mailed Mar. 13, 2014 (Chinese Search Report was previously submitted on Jun. 23, 2014).

Yanqin Li, Aurora Rizzo, Roberto Cingolani, and Giuseppe Gigli "Bright White-Light-Emitting Device from Ternary Nanocrystal Composites" Advanced Materials, article first published Oct. 2006, vol. 18, No. 19, pp. 2545-2548.

International Publication of WO 2015/021699 published on Feb. 19, 2015.

\* cited by examiner

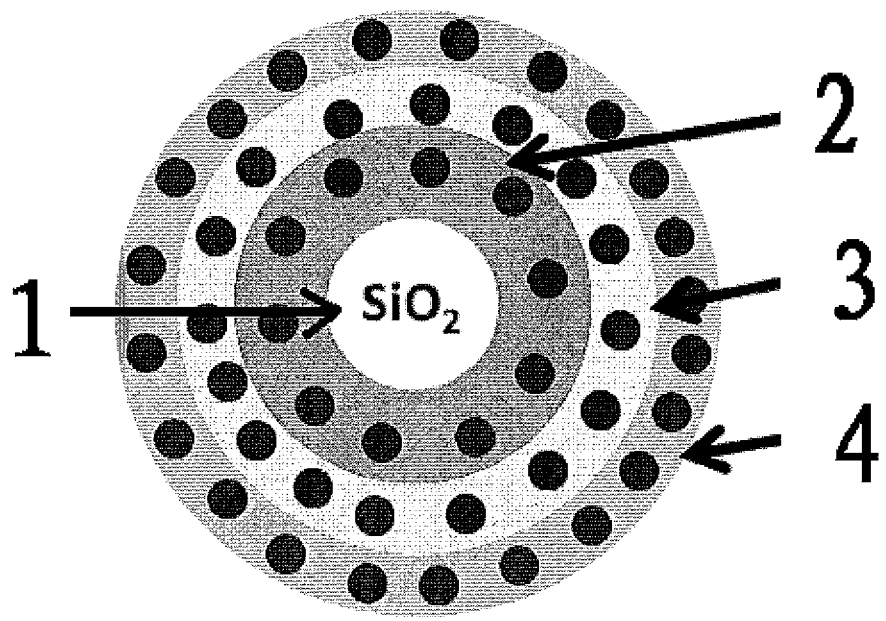

US 9,257,600 B2

WHITE LIGHT QUANTUM DOT COMPLEX PARTICLE AND PROCESS FOR PREPARING SAME

CROSS REFERENCE TO RELATED APPLICATIONS

This application is the National Stage of PCT/CN2013/087165 filed on Nov. 14, 2013, which claims priority under 35 U.S.C. §119 of Chinese Application No. 201310359549.5 filed on Aug. 16, 2013, the disclosure of which is incorporated by reference.

TECHNICAL FIELD

Embodiments of the invention relates to a white light quantum dot complex particle and a process for preparing the same.

BACKGROUND

Great progress has been achieved for the organic light-emitting diode (OLED) technique in recent years. Since OLED has the advantages of low cost, short response time, high brightness, wide visual angle, low driving voltage and capacity of flexible display, etc., it has become a flat panel full color display technique with great prospect of development. Along with single color OLED having more and more mature properties, white light OLED (WOLED), as a novel solid state light source, has exhibited good prospect of application in illumination and flat panel display backlight source and elicited wide attention, whose efficiency and performance have been rapidly improved. The emission spectra of most fluorescent and phosphorescent organic light emitting materials can only cover about one third of the spectrum of the visible light. Therefore, organic light emitting materials capable of emitting red light, green light, and blue light can be mixed together to combine their emission spectra to white light. For light emitting materials used for WOLED, presence of impurities will cause quenching of excitons and increase of the resistance of the device, resulting in low light emitting efficiency and shorter life. Purification of the organic materials accounts for a large portion in the cost control of WOLED. Currently, WOLED are all prepared by vacuum evaporation process of small molecular organic materials which has high process cost and severe waste of raw materials. The goal for WOLED development is a real low cost, high efficiency, and long lasting flat panel white light source.

Quantum dots, also called semiconductor nano crystals, belong to a new kind of semiconductor nanomaterials with a size of 1-10 nm. The quantum size effect and quantum confinement effect enable them to have unique photoluminescent and electroluminescent performance. Compared with traditional organic fluorescent dyes, the quantum dots have high quantum yield, high photochemical stability, resistance to photolysis, as well as excellent optical properties such as wide excitation, narrow emission, high color purity, and adjustability of light color by controlling the size of the quantum dots, etc. WOLEDs prepared using quantum dots in place of small molecular organic materials have the advantages of high luminescent efficiency, good stability, long life, high brightness, wide color range, etc.

The usual process for making a white light source using quantum dots is to mix RGB three colored quantum dots in a certain ratio. The process has the following disadvantages: the three kinds of RGB quantum dots are prone to agglomeration, leading to poor stability; the mixing ratio of the three base colors is hard to control; the emission spectrum is not stable, the light is not even and the process is complicated. Therefore, the aforesaid technical problems are in urgent need to be solved.

SUMMARY

Embodiments of the invention provide a white light quantum dot complex particle having controllable particle sizes, uniform sizes, and high stability, and solve the technical problems present during using the quantum dots as the white light source: poor stability, unstable emission spectrum, uneven light, and complicated process.

In the first aspect, an embodiment of the invention provides a white light quantum dot complex particle, comprising a seed particle in the core, and a first shell layer, a second shell layer and a third shell layer coated in order on the seed particle; each of the first shell layer, second shell layer and third shell layer is one of a red (R) light quantum dot layer, a green (G) light quantum dot layer and a blue (B) light quantum dot layer, and is different from one another.

In the complex particle of the embodiment of the invention, the quantum dot layers of the aforesaid three colors can be combined arbitrarily, all can lead to the white light quantum dot complex particle according to the embodiment of the invention.

In the complex particle of the invention, the seed particle may be an inorganic nanoparticle, such as silicon dioxide nanoparticle, $Al_2O_3$ nanoparticle or ZnO nanoparticle, and may be a silicon dioxide nanoparticle with surface modification with a polymerizable double bond. The polymerizable double bond may be introduced through the process for preparing a sol-gel, or modification during the later stage of the preparation. The silicon dioxide nanoparticles of the embodiment of the invention are usually prepared by way of sol-gel and have uniform sizes.

For example, the particle size of the seed particle is 10-500 nm, preferably 20-50 nm; the range of the thickness of the first, second, third shell layers is optionally 5-50 nm, preferably 10-20 nm. For example, the thickness of each shell layer is maintained as identical.

For example, the ratio of amount of the R:G:B quantum dots may be 0.5~0.8:1:1.2~1.5, for example, 0.65~0.74:1:1.25~1.35.

In the complex particle of the embodiment of the invention, the red light quantum dot is a CdSe quantum dot with an emission wavelength of 600~700 nm; the green light quantum dot is a CdSe quantum dot with an emission wavelength of 490~570 nm; and the blue light quantum dot is a CdSe quantum dot with an emission wavelength of 430~460 nm. For example, the red light quantum dot is a CdSe quantum dot with an emission wavelength of 613 nm; the green light quantum dot is a CdSe quantum dot with an emission wavelength of 555 nm; and the blue light quantum dot is a CdSe quantum dot with an emission wavelength of 452 nm.

The embodiments of the invention can confine the RGB three color quantum dots in a spherical space, which can solve the issues of the current quantum dot materials such as poor stability, low quantum efficiency, and the like. Moreover, single RGB complex particles can serve as white light emitting sources, which are combined to form a white light emitting layer with homogenous light, thereby simplifying the process for preparing the WOLED device.

An embodiment of the invention provides a process for preparing a white light quantum dot complex particle, which enable rapid and convenient batch preparation of the white light quantum dot complex particle, thereby improving the marketability of said complex particle.

Another aspect of the invention provides a process for preparing a light quantum dot complex particle, comprising dispersing a seed particle in water to obtain a seed suspension; mixing the red light quantum dot, green light quantum dot and blue light quantum dot with a monomer, an initiator, a surfactant and water, respectively, for emulsification to obtain three emulsion systems, designated as the emulsion system A, the emulsion system B and the emulsion system C, respectively; heating the seed suspension to 60-90° C., to which the emulsion system A is dripped, and then reacting with constant temperature for 2-10 h; then dripping the emulsion system B into the seed suspension, and then reacting with constant temperature for 2-10 h; then dripping the emulsion system C into the seed suspension, and then reacting with constant temperature for 2-10 h, to form the first shell layer, second shell layer and third shell layer in order; washing the product after the conclusion of the reaction to obtain the white light quantum dot complex particle.

For example, the same method may be employed for the process for preparing the emulsion systems A, B, C, or the method may be adjusted within the optional range defined in the invention. The emulsion systems A, B, C are not limited to a certain quantum dot emulsion system. A person skilled in the art can arbitrarily designate emulsion systems which comprise the red light quantum dot, green light quantum dot and blue light quantum dot as emulsion systems A, B, C and wrap them in order, to achieve arbitrary combinations of the multiple color quantum dots in the first shell layer, second shell layer and third shell layer.

For example, in the process for forming the first shell layer, second shell layer, and third shell layer, the same process parameter, such as the rate of dripping each emulsion system, reaction time, and the like, may also be used. A person skilled in the art can expect that the complex particle claimed in the invention is obtainable by choosing the same or different processes for preparing the emulsion systems or forming the shell layer within the optional range provided in the present disclosure. It is preferred to employ the same process parameters in the embodiments of the invention to obtain the white light quantum dot complex particle with more uniform and controllable quality.

For example, the weight percent concentration of the seed particle may be 5-8%, for example, 5.5-7%.

For example, the particle size for the seed particle may be 10-500 nm, for example, 20-50 nm.

For example, the monomer may be at least one of the alkenes having a total of 4-24 carbon atoms, preferably styrene. The weight percentage of the monomer in each emulsion system may be 0.1-20%, for example, 0.2-10%.

For example, the initiator is at least one of potassium persulfate, ammonium persulfate, sodium persulfate and hydrogen peroxide, preferably potassium persulfate and sodium persulfate. The weight percentage of the initiator may be 0.1%-8%, for example, 0.5%-4% by weight of the monomer.

For example, the surfactant is at least one of sodium dodecyl sulfate, sodium dodecyl sulfonate or cetyltrimethylammonium bromide, preferably sodium dodecyl sulfate and cetyltrimethylammonium bromide. The weight percentage of the surfactant in each emulsion system may be 0.1-10%, for example, 0.5-5%.

In the preparative process of the embodiments of the invention, for example, the weight percentage of the red light quantum dot, blue light quantum dot and green light quantum dot in each emulsion system may be 0.08-12%, but is not limited to these. Preferably, the weight percentage of the red light quantum dot, blue light quantum dot and green light quantum dot in each emulsion system may be 0.9-2.66%.

For example, the weight ratio between the seed particle and the green light quantum dot is 10-12.5:1, such as 10:1, 12:1 and 12.5:1 recited in the embodiments.

For example, the rate of dripping each emulsion system may be 0.01-5 ml/min, such as 0.1-0.5 ml/min.

For example, the temperature for the seed suspension may be 60-90° C., for example, 75-85° C., preferably 80° C.; and the time for the constant temperature reaction may be 2-10 hours, for example, 4-8 hours.

In the preparative process of the embodiment of the invention, better and rapider preparation can be achieved for the dispersion of the seed particle and the emulsification process involved in the formation of the emulsion system by way of the existing assisting means, including, but not limited to ultrasound assist. Any technical means capable of accelerating the dispersion and emulsification can be applied to the technical solution to achieve the embodiments of the present invention.

A preparative process in one embodiment of the invention comprises dispersing a silicon dioxide nanoparticle in water to obtain a seed suspension, followed by dripping emulsion systems that comprise the red light quantum dot, green light quantum dot and blue light quantum dot, respectively, into the seed suspension in a certain ratio for reaction, and coating them layer by layer around the seed sphere, to obtain the white light quantum dot complex particle, wherein the emulsion system is obtained by mixing the quantum dot, a monomer, an initiator, a surfactant, and water for emulsification. This preparative process is simple and convenient and is ready for batch manufacture.

For example, the optional ratio of the R:G:B quantum dots may be 0.5~0.8:1:1.2~1.5, for example, 0.65~0.74:1:1.25~1.35. The range of the thickness of the formed first, second, third shell layers may be 5-50 nm, for example, 10-20 nm. As a desirable embodiment, the thickness of each shell layer is maintained as the same.

For example, in the preparative process of the invention, after the conclusion of the reaction, the product can be centrifuged and washed with ethanol/water.

DESCRIPTION OF DRAWINGS

In order to more clearly demonstrate the technical solution of the invention, the drawings of the embodiments will be briefly introduced below. Apparently, the drawings in the below description merely relate to some embodiments of the invention, rather than limit the invention.

FIG. 1 is the structural diagram for the white light quantum dot complex particle of the embodiment of the invention.

INDICATORS OF THE DRAWING

1: seed particle; 2: first shell layer; 3: second shell layer; 4: third shell layer.

DETAILED DESCRIPTION

In order to make the purpose, technical solutions and advantages of the invention clearer, the technical solutions of the embodiments of the invention is described in a clear and complete manner below in relation to the drawings of the embodiments of the invention. Obviously, the embodiments described are merely some rather than all embodiments of the invention. All other embodiments obtainable by a person of ordinary skill in the art without inventive work on the basis of the embodiments of the invention fall into the scope of the invention.

The white light quantum dot complex particle of the embodiment of the invention comprise a seed particle in the core, and a first shell layer, a second shell layer and a third shell layer coated in order on the seed particle, wherein each of the first shell layer, second shell layer and third shell layer is one of a red light quantum dot layer, a green light quantum dot layer and a blue light quantum dot layer, and is different from one another.

The seed particle can be an inorganic nanoparticle, such as a silicon dioxide nanoparticle, an aluminum oxide ($Al_2O_3$) nanoparticle or zinc oxide (ZnO) nanoparticle. The inorganic nanoparticle can serve as an optimal seed particle to provide the core for the complex particle to ensure its light emitting performance.

As recited in the aforesaid embodiments, the seed particle of the complex particle of the embodiment of the invention, for example, may have its surface modified with a silicon dioxide nanoparticle having a polymerizable double bond.

In the complex particle of the embodiment of the invention, the ratio of amount of the R:G:B quantum dots may be 0.5~0.8:1:1.2~1.5, for example, 0.65~0.74:1:1.25~1.35 (that is, using the green light quantum dot as the reference). In the complex particle formed within the scope of the aforesaid levels, the first, second and third shell layer may be combined to form a white light emitting layer with homogenous light, thereby simplifying the process for preparing the WOLED device.

Furthermore, in the complex particle of the embodiment of the invention, the particle size for the seed particle may be 10-500 nm, for example, preferably 20-50 nm. The range of the thickness of the first, second, third shell layers may be 5-50 nm, preferably 10-20 nm. As an optimal technical solution, the thickness of each shell layer is maintained as identical.

The ratio of amount of the seed particle and each colored quantum dot in the embodiment of the invention can be chosen and adjusted according to practical conditions. Although the thickness of each shell layer in the complex particle can be defined, the inventor optimized the ratio of the level of the two during the practical research to obtain complex particle of higher quality, and specifically exhibited in the following examples. Taking the green light quantum dot as an example, preferably, the weight ratio between the seed particle and the green light quantum dot is 10-12.5:1, more preferably as 10:1, 12:1 and 12.5:1 recited in the embodiments. Under such a range of ratio of levels, the seed particle can better form a stable laminate structure with each colored quantum dot, to ensure its excellent light emitting performance as a white light source.

In the complex particle of the embodiment of the invention, the red light quantum dot is a CdSe quantum dot with an emission wavelength of 600~700 nm; the green light quantum dot is a CdSe quantum dot with an emission wavelength of 490~570 nm; and blue light quantum dot is a CdSe quantum dot with an emission wavelength of 430~460 nm. For example, more preferably the red light quantum dot is a CdSe quantum dot with an emission wavelength of 613 nm; the green light quantum dot is a CdSe quantum dot with an emission wavelength of 555 nm; and the blue light quantum dot is a CdSe quantum dot with an emission wavelength of 452 nm. In the invention, the range from which the emission wavelength for each colored quantum dot can be selected has been screened to tested to further improve the quality of the complex particle, so as to make the emission spectrum more stable and the light more uniform.

Another embodiment of the invention further provides a process for preparing the white light quantum dot complex particle as follows.

Step 1: dispersing a seed particle in water to obtain a seed suspension.

Step 2: mixing the red light quantum dot, green light quantum dot and blue light quantum dot with a monomer, an initiator, a surfactant and water, respectively, for emulsification to obtain three emulsion systems, designated as the emulsion system A, the emulsion system B and the emulsion system C, respectively.

Step 3: heating the seed suspension to 60-90° C., to which the emulsion system A is dripped, and after the conclusion of the dripping, reacting with constant temperature for 2-10 h; then dripping the emulsion system B into the seed suspension, and after the conclusion of the dripping, reacting with constant temperature for 2-10 h; then dripping the emulsion system C into the seed suspension, and after the conclusion of the dripping, reacting with constant temperature for 2-10 h, to form the first shell layer, second shell layer and third shell layer in order.

Step 4: washing the product after the conclusion of the reaction to obtain the white light quantum dot complex particle. For example, the product is centrifuged and washed with ethanol/water. The choice for the concentration of the washing solution and the specific wash operation is not particularly limited in the invention.

In step 1, the seed particle is dispersed in water to obtain a seed suspension. The weight percentage of the seed particle in the seed suspension is 5-8%, preferably 5.5-7%. The seed particle is an inorganic nanoparticle, such as a silicon dioxide nanoparticle, an $Al_2O_3$ nanoparticle or a ZnO nanoparticle, preferably a silicon dioxide nanoparticle having its surface modified with a polymerizable double bond.

In the preparative process of the invention, the monomer of Step 2 may be at least one of the alkenes having a total of 4-24 carbon atoms, preferably styrene. The weight percentage of the monomer in each emulsion system may be 0.1-20%, for example, preferably 0.2-10%.

The initiator may be at least one of potassium persulfate, ammonium persulfate, sodium persulfate or hydrogen peroxide, preferably potassium persulfate or sodium persulfate. The weight percentage of the initiator may be 0.1%-8%, for example, preferably 0.5%-4% by weight of the monomer.

The surfactant may be at least one of sodium dodecyl sulfate, sodium dodecyl sulfonate or cetyltrimethylammonium bromide, preferably sodium dodecyl sulfate or cetyltrimethylammonium bromide. The weight percentage of the surfactant in each emulsion system may be 0.1-10%, for example, preferably 0.5-5%.

Furthermore, the weight percentage of the red light quantum dot, blue light quantum dot and green light quantum dot in each emulsion system of the invention may be, but is not limited to 0.08-12%, for example, preferably 0.9-2.66%. In an example, the weight percentage of the red light quantum dot in each emulsion system may be 0.1-8%, preferably 0.9-1.43%, the weight percentage of the green light quantum dot in each emulsion system may be 0.1-10%, preferably 1.75-1.8%, the weight percentage of the blue light quantum dot in each emulsion system may be 0.08-12%, preferably 2.14-2.66%.

On the basis of plenty of experimental research, the inventors found that by the combined use of the aforesaid selections (type and level) of the monomer, initiator, and surfactant, the emulsification process can be optimized to ensure the desired stability and uniformity of the emulsion systems A, B, C, favors the formation of each shell layer in Step 3, and in the meanwhile can also make the whole preparative process simpler and easier to carry out, and more favorable batch manufacture.

In the preparative process of the embodiment of the invention, the weight ratio between the seed particle and the green light quantum dot can be 10-12.5:1, more preferably 10:1, 12:1 and 12.5:1.

In Step 3, the rate for dripping each emulsion system may be 0.01-5 ml/min, for example, preferably 0.1-0.5 ml/min. Under such a rate for dipping, the formation of the shell layer is more controllable.

In Step 3, the temperature for the seed suspension may be 60-90☐, for example, preferably 75-85☐, more preferably 80☐. The constant temperature reaction time may be 2-10 hours, for example, preferably 4-8 hours. Under such a reaction condition, the wrapping of each shell layer around the seed particle layer by layer is favored, finally leading to a white light emitting source with high stability and high quantum efficiency.

The embodiments of the invention are further introduced in details from the specific examples.

EXAMPLE 1

White Light Quantum Dot Complex Particle

The white light quantum dot complex particle as shown in FIG. 1 comprises seed particle 1 in the core and the first shell layer 2 (red light quantum dot layer), second shell layer 3 (green light quantum dot layer), and third shell layer 4 (blue light quantum dot layer) wrapped around the seed particle 1 in order.

In the complex particle of the example, the seed particle is a silicon dioxide nanoparticle having a particle size of 30 nm whose surface is modified with a polymerizable double bond. In the first, second, third shell layers in the complex particle, the ratio of amount of the red light, green light and blue light quantum dots is 0.72:1:1.23. The red light quantum dot is a CdSe quantum dot with an emission wavelength of 613 nm; the green light quantum dot is a CdSe quantum dot with an emission wavelength of 555 nm; and the blue light quantum dot is a CdSe quantum dot with an emission wavelength of 452 nm. The thicknesses of the first, second, third shell layers in the complex particle formed are all about 20 nm.

The complex particle of the example can be obtained by the preparative process of the invention. A person skilled in the art can expect that the white light quantum dot complex particle is obtainable by using the preparative process recited in any one of Examples 6-12, as long as conventional adjustment declared in the application document is conducted (such as the adjustment of the order of the wrapping of each quantum dot layers, the adjustment of the ratio of amount of each colored quantum dot and the seed particle, and suitable adjustment of the reaction conditions). Therefore, it will not be repeated one by one in the present disclosure.

EXAMPLE 2

White Light Quantum Dot Complex Particle

As compared with Example 1, the present example is distinguished in that the seed particle in the example is a silicon dioxide nanoparticle having a particle size of 20 nm whose surface is modified with a polymerizable double bond. The first shell layer 2 is a blue light quantum dot layer, the second shell layer 3 is a green light quantum dot layer, and the third shell layer 4 is a red light quantum dot layer. In the complex particle, the ratio of amount of the red light, green light and blue light quantum dots is 0.65:1:1.25. The thicknesses of the first, second, third shell layers in the complex particle formed are all 10 nm.

EXAMPLE 3

White Light Quantum Dot Complex Particle

As compared with Example 1, the present example is distinguished in that the seed particle in the example is a silicon dioxide nanoparticle having a particle size of 50 nm whose surface is modified with a polymerizable double bond. The first shell layer 2 is a green light quantum dot layer, the second shell layer 3 is a red light quantum dot layer, and the third shell layer 4 is a blue light quantum dot layer. In the complex particle, the ratio of amount of the red light, green light and blue light quantum dots is 0.74:1:1.35. The thicknesses of the first, second, third shell layers in the complex particle formed are all 50 nm.

EXAMPLE 4

White Light Quantum Dot Complex Particle

As compared with Example 1, the present example is distinguished in that the seed particle in the example is a silicon dioxide nanoparticle having a particle size of 10 nm whose surface is modified with a polymerizable double bond. The first shell layer 2 is a green light quantum dot layer, the second shell layer 3 is a blue light quantum dot layer, and the third shell layer 4 is a red light quantum dot layer. In the complex particle, the ratio of amount of the red light, green light and blue light quantum dots is 0.5:1:1.2. The thickness of the first, second, third shell layers in the complex particle formed is 5 nm, 12 nm and 20 nm, respectively.

EXAMPLE 5

White Light Quantum Dot Complex Particle

As compared with Example 1, the present example is distinguished in that the seed particle in the example is a silicon dioxide nanoparticle having a particle size of 500 nm whose surface is modified with a polymerizable double bond. The first shell layer 2 is a blue light quantum dot layer, the second shell layer 3 is a green light quantum dot layer, and the third shell layer 4 is a red light quantum dot layer. In the complex particle, the ratio of amount of the red light, green light and blue light quantum dots is 0.8:1:1.2. The thickness of the first, second, third shell layers in the complex particle formed is 450 nm, 400 nm and 380 nm, respectively.

EXAMPLE 6

Process for Preparing White Light Quantum Dot Complex Particle (1) dispersing 1 g silicon dioxide nanoparticle with a diameter of 100 nm in 15 g water and dispersing the particle thoroughly with ultrasound to obtain a seed suspension with a weight percentage of 6.25%;

(2) mixing 0.05 g red light quantum dot, 0.2 g styrene monomer (St), 0.1 g surfactant sodium dodecyl sulfonate (SDS), 0.2 g 1% by weight percent of a potassium persulfate (KPS) aqueous solution as an initiator and 5 g water for ultrasound emulsification to obtain the emulsion system A; wherein the weight percentage of the monomer in the emulsion system is 3.6%, the weight percentage of the initiator to the weight of the monomer is 1%, the weight percentage of the surfactant in the emulsion system is 1.8%, and the weight percentage of the red light quantum dot in the emulsion system is 0.9%;

mixing 0.1 g green light quantum dot, 0.2 g styrene monomer (St), 0.1 g surfactant sodium dodecyl sulfonate (SDS), 0.2 g 1% by weight percent of a potassium persulfate (KPS) aqueous solution as an initiator and 5 g water for ultrasound emulsification to obtain the emulsion system B; wherein the weight percentage of the monomer in the emulsion system is 3.57%, the weight percentage of the initiator to the weight of the monomer is 1%, the weight percentage of the surfactant in the emulsion system is 1.78%, and the weight percentage of the green light quantum dot in the emulsion system is 1.78%; and mixing 0.15 g blue light quantum dot, 0.2 g styrene monomer (St), 0.1 g surfactant sodium dodecyl sulfonate (SDS), 0.2 g 1% by weight percent of a potassium persulfate (KPS) aqueous solution as an initiator and 5 g water for ultrasound emulsification to obtain the emulsion system C; wherein the weight percentage of the monomer in the emulsion system is 3.54%, the weight percentage of the initiator to the weight of the monomer is 1%, the weight percentage of the surfactant in the emulsion system is 1.78%, and the weight percentage of the blue light quantum dot in the emulsion system is 2.66%;

(3) heating the aforesaid seed suspension to 80□, followed by dripping the aforesaid emulsion system A with a dripping rate of 0.1 ml/min; after the conclusion of the dripping, keeping the temperature constant for 4 hours, then starting dripping the aforesaid emulsion system B with a dripping rate of 0.1 ml/min; after the conclusion of the dripping, keeping the temperature constant for 4 hours, than starting dripping the aforesaid emulsion system C with a dripping rate of 0.1 ml/min; after the conclusion of the dripping, keeping the temperature constant for 4 hours.

(4) after the conclusion of the reaction, centrifuging and washing the product with ethanol/water, to obtain the white light quantum dot complex particle as shown in FIG. 1.

In the example, the weight ratio of the seed particle and the green light quantum dot is 10:1.

EXAMPLE 7

Process for Preparing White Light Quantum Dot Complex Particle (1) dispersing 1.2 g silicon dioxide nanoparticle with a diameter of 100 nm in 15 g water and dispersing the particle thoroughly with ultrasound to obtain a seed suspension with a weight percentage of 7.4%;

(2) mixing 0.06 g red light quantum dot, 0.25 g styrene monomer (St), 0.1 g surfactant sodium dodecyl sulfonate (SDS), 0.25 g 1% by weight percent of a potassium persulfate (KPS) aqueous solution as an initiator and 5 g water for ultrasound emulsification to obtain the emulsion system A; wherein the weight percentage of the monomer in the emulsion system is 4.4%, the weight percentage of the initiator to the weight of the monomer is 1%, the weight percentage of the surfactant in the emulsion system is 1.77%, and the weight percentage of the red light quantum dot in the emulsion system is 1.06%;

mixing 0.1 g green light quantum dot, 0.25 g styrene monomer (St), 0.1 g surfactant sodium dodecyl sulfonate (SDS), 0.25 g 1% by weight percent of a potassium persulfate (KPS) aqueous solution as an initiator and 5 g water for ultrasound emulsification to obtain the emulsion system B; wherein the weight percentage of the monomer in the emulsion system is 4.38%, the weight percentage of the initiator to the weight of the monomer is 1%, the weight percentage of the surfactant in the emulsion system is 1.75%, and the weight percentage of the green light quantum dot in the emulsion system is 1.75%; and mixing 0.14 g blue light quantum dot, 0.25 g styrene monomer (St), 0.1 g surfactant sodium dodecyl sulfonate (SDS), 0.25 g 1% by weight percent of a potassium persulfate (KPS) aqueous solution as an initiator and 5 g water for ultrasound emulsification to obtain the emulsion system C; wherein the weight percentage of the monomer in the emulsion system is 4.4%, the weight percentage of the initiator to the weight of the monomer is 1%, the weight percentage of the surfactant in the emulsion system is 1.74%, and the weight percentage of the blue light quantum dot in the emulsion system is 2.44%;

(3) heating the aforesaid seed suspension to 70□, followed by dripping the aforesaid emulsion system A with a dripping rate of 0.12 ml/min; after the conclusion of the dripping, keeping the temperature constant for 4 hours, then starting dripping the aforesaid emulsion system B with a dripping rate of 0.12 ml/min; after the conclusion of the dripping, keeping the temperature constant for 4 hours, then starting dripping the aforesaid emulsion system C with a dripping rate of 0.12 ml/min; after the conclusion of the dripping, keeping the temperature constant for 4 hours.

(4) after the conclusion of the reaction, centrifuging and washing the product with ethanol/water, to obtain the white light quantum dot complex particle as shown in FIG. 1.

In the example, the weight ratio of the seed particle and the green light quantum dot is 12:1,

EXAMPLE 8

Process for Preparing White Light Quantum Dot Complex Particle (1) dispersing 1 g silicon dioxide nanoparticle with a diameter of 100 nm in 15 g water and dispersing the particle thoroughly with ultrasound to obtain a seed suspension with a weight percentage of 6.25%;

(2) mixing 0.08 g red light quantum dot, 0.2 g methyl methacrylate monomer (PMMA), 0.1 g surfactant sodium dodecyl sulfonate (SDS), 0.2 g 1% by weight percent of a potassium persulfate (KPS) aqueous solution as an initiator and 5 g water for ultrasound emulsification to obtain the emulsion system A; wherein the weight percentage of the monomer in the emulsion system is 3.58%, the weight percentage of the initiator to the weight of the monomer is 1%, the weight percentage of the surfactant in the emulsion system is 1.79%, and the weight percentage of the red light quantum dot in the emulsion system is 1.43%;

mixing 0.1 g green light quantum dot, 0.2 g methyl methacrylate monomer (PMMA), 0.1 g surfactant sodium dodecyl sulfonate (SDS), 0.2 g 1% by weight percent of a potassium persulfate (KPS) aqueous solution as an initiator and 5 g water for ultrasound emulsification to obtain the emulsion system B; wherein the weight percentage of the monomer in the emulsion system is 3.57%, the weight percentage of the initiator to the weight of the monomer is 1%, the weight percentage of the surfactant in the emulsion system is 1.79%, and the weight percentage of the green light quantum dot in the emulsion system is 1.79%; and mixing 0.12 g blue light quantum dot, 0.2 g methyl methacrylate monomer (PMMA), 0.1 g surfactant sodium dodecyl sulfonate (SDS), 0.2 g 1% by weight percent of a potassium persulfate (KPS) aqueous solution as an initiator and 5 g water for ultrasound emulsification to obtain the emulsion system C; wherein the weight percentage of the monomer in the emulsion system is 3.56%, the weight percentage of the initiator to the weight of the monomer is 1%, the weight percentage of the surfactant in the emulsion system is 1.78%, and the weight percentage of the blue light quantum dot in the emulsion system is 2.14%;

(3) heating the aforesaid seed suspension to 80□, followed by dripping the aforesaid emulsion system A with a dripping rate of 0.1 ml/min; after the conclusion of the dripping, keeping the temperature constant for 4 hours, then starting dripping the aforesaid emulsion system B with a dripping rate of 0.1 ml/min; after the conclusion of the dripping, keeping the temperature constant for 4 hours, then starting dripping the aforesaid emulsion system C with a dripping rate of 0.1 ml/min; after the conclusion of the dripping, keeping the temperature constant for 4 hours.

(4) after the conclusion of the reaction, centrifuging and washing the product with ethanol/water, to obtain the white light quantum dot complex particle as shown in FIG. 1.

In the example, the weight ratio of the seed particle and the green light quantum dot is 10:1.

EXAMPLE 9

Process for Preparing White Light Quantum Dot Complex Particle (1) dispersing 1 g silicon dioxide nanoparticle with a diameter of 20 nm in 19 g water and dispersing the particle thoroughly with ultrasound to obtain a seed suspension with a weight percentage of 5%;

(2) mixing 0.08 g red light quantum dot, 0.2 g methacryloyloxypropyltrimethoxysilane, 0.1 g surfactant sodium dodecyl sulfate, 0.2 g 8% by weight percent of an ammonium persulfate aqueous solution as an initiator and 0.42 g water for ultrasound emulsification to obtain the emulsion system A; wherein the weight percentage of the monomer in the emulsion system is 20%, the weight percentage of the initiator to the weight of the monomer is 8%, the weight percentage of the surfactant in the emulsion system is 10%, and the weight percentage of the red light quantum dot in the emulsion system is 8%;

mixing 0.1 g green light quantum dot, 0.2 g methacryloyloxypropyltrimethoxysilane, 0.1 g surfactant sodium dodecyl sulfate, 0.2 g 8% by weight percent of an ammonium persulfate aqueous solution as an initiator and 0.4 g water for ultrasound emulsification to obtain the emulsion system A; wherein the weight percentage of the monomer in the emulsion system is 20%, the weight percentage of the initiator to the weight of the monomer is 8%, the weight percentage of the surfactant in the emulsion system is 10%, and the weight percentage of the green light quantum dot in the emulsion system is 8%; and mixing 0.12 g blue light quantum dot, 0.2 g methacryloyloxypropyltrimethoxysilane, 0.1 g surfactant sodium dodecyl sulfate, 0.2 g 8% by weight percent of an ammonium persulfate aqueous solution as an initiator and 0.38 g water for ultrasound emulsification to obtain the emulsion system A; wherein the weight percentage of the monomer in the emulsion system is 20%, the weight percentage of the initiator to the weight of the monomer is 8%, the weight percentage of the surfactant in the emulsion system is 10%, and the weight percentage of the blue light quantum dot in the emulsion system is 12%;

(3) heating the aforesaid seed suspension to 80□, followed by dripping the aforesaid emulsion system A with a dripping rate of 0.1 ml/min; after the conclusion of the dripping, keeping the temperature constant for 8 hours, then starting dripping the aforesaid emulsion system B with a dripping rate of 0.1 ml/min; after the conclusion of the dripping, keeping the temperature constant for 8 hours, then starting dripping the aforesaid emulsion system C with a dripping rate of 0.1 ml/min; after the conclusion of the dripping, keeping the temperature constant for 8 hours.

(4) after the conclusion of the reaction, centrifuging and washing the product with ethanol/water, to obtain the white light quantum dot complex particle as shown in FIG. 1.

In the example, the weight ratio of the seed particle and the green light quantum dot is 10:1.

EXAMPLE 10

Process for Preparing White Light Quantum Dot Complex Particle (1) dispersing 1 g silicon dioxide nanoparticle with a diameter of 50 nm in 11.5 g water and dispersing the particle thoroughly with ultrasound to obtain a seed suspension with a weight percentage of 8%;

(2) mixing 0.08 g green light quantum dot, 0.2 g methacryloyloxypropyltrimethoxysilane, 0.1 g surfactant cetyltrimethylammonium bromide, 0.2 g 4% by weight percent of an sodium persulfate aqueous solution as an initiator and 1.42 g water for ultrasound emulsification to obtain the emulsion system A; wherein the weight percentage of the monomer in the emulsion system is 10%, the weight percentage of the initiator to the weight of the monomer is 4%, the weight percentage of the surfactant in the emulsion system is 5%, and the weight percentage of the green light quantum dot in the emulsion system is 4%;

mixing 0.1 g blue light quantum dot, 0.2 g methacryloyloxypropyltrimethoxysilane, 0.1 g surfactant cetyltrimethylammonium bromide, 0.2 g 4% by weight percent of a sodium persulfate aqueous solution as an initiator and 1.4 g water for ultrasound emulsification to obtain the emulsion system A; wherein the weight percentage of the monomer in the emulsion system is 10%, the weight percentage of the initiator to the weight of the monomer is 4%, the weight percentage of the surfactant in the emulsion system is 5%, and the weight percentage of the blue light quantum dot in the emulsion system is 5%; and mixing 0.12 g red light quantum dot, 0.2 g methacryloyloxypropyltrimethoxysilane, 0.1 g surfactant cetyltrimethylammonium bromide, 0.2 g 4% by weight percent of a sodium persulfate aqueous solution as an initiator and 1.38 g water for ultrasound emulsification to obtain the emulsion system A; wherein the weight percentage of the monomer in the emulsion system is 10%, the weight percentage of the initiator to the weight of the monomer is 4%, the weight percentage of the surfactant in the emulsion system is 5%, and the weight percentage of the red light quantum dot in the emulsion system is 6%;

(3) heating the aforesaid seed suspension to 80□, followed by dripping the aforesaid emulsion system A with a dripping rate of 0.5 ml/min; after the conclusion of the dripping, keeping the temperature constant for 2 hours, then starting dripping the aforesaid emulsion system B with a dripping rate of 0.5 ml/min; after the conclusion of the dripping, keeping the temperature constant for 2 hours, then starting dripping the aforesaid emulsion system C with a dripping rate of 0.5 ml/min; after the conclusion of the dripping, keeping the temperature constant for 2 hours.

(4) after the conclusion of the reaction, centrifuging and washing the product with ethanol/water, to obtain the white light quantum dot complex particle as shown in FIG. 1.

In the example, the weight ratio of the seed particle and the green light quantum dot is 12.5:1.

EXAMPLE 11

Process for Preparing White Light Quantum Dot Complex Particle (1) dispersing 1 g silicon dioxide nanoparticle with a diameter of 500 nm in 14.2 g water and dispersing the particle thoroughly with ultrasound to obtain a seed suspension with a weight percentage of 6.6%;

(2) mixing 0.1 g green light quantum dot, 0.1 g methacryloyloxypropyltrimethoxysilane, 0.1 g surfactant cetyltrimethylammonium bromide, 0.1 g 0.1% by weight percent of a hydrogen peroxide aqueous solution as an initiator and 99.6 g water for ultrasound emulsification to obtain the emulsion system A; wherein the weight percentage of the monomer in the emulsion system is 0.1%, the weight percentage of the initiator to the weight of the monomer is 0.1%, the weight percentage of the surfactant in the emulsion system is 5%, and the weight percentage of the green light quantum dot in the emulsion system is 0.1%;

mixing 0.12 g red light quantum dot, 0.1 g methacryloyloxypropyltrimethoxysilane, 0.1 g surfactant cetyltrimethylammonium bromide, 0.1 g 0.1% by weight percent of a hydrogen peroxide aqueous solution as an initiator and 99.58 g water for ultrasound emulsification to obtain the emulsion system A; wherein the weight percentage of the monomer in the emulsion system is 0.1%, the weight percentage of the initiator to the weight of the monomer is 0.1%, the weight percentage of the surfactant in the emulsion system is 0.1%, and the weight percentage of the red light quantum dot in the emulsion system is 5%; and mixing 0.1 g blue light quantum dot, 0.1 g methacryloyloxypropyltrimethoxysilane, 0.1 g surfactant cetyltrimethylammonium bromide, 0.1 g 0.1% by weight percent of a hydrogen peroxide aqueous solution as an initiator and 99.6 g water for ultrasound emulsification to obtain the emulsion system A; wherein the weight percentage of the monomer in the emulsion system is 0.1%, the weight percentage of the initiator to the weight of the monomer is 0.1%, the weight percentage of the surfactant in the emulsion system is 0.1%, and the weight percentage of the blue light quantum dot in the emulsion system is 0.1%;

(3) heating the aforesaid seed suspension to 80□, followed by dripping the aforesaid emulsion system A with a dripping rate of 5 ml/min; after the conclusion of the dripping, keeping the temperature constant for 10 hours, then starting dripping the aforesaid emulsion system B with a dripping rate of 5 ml/min; after the conclusion of the dripping, keeping the temperature constant for 10 hours, then starting dripping the aforesaid emulsion system C with a dripping rate of 5 ml/min; after the conclusion of the dripping, keeping the temperature constant for 10 hours.

(4) after the conclusion of the reaction, centrifuging and washing the product with ethanol/water, to obtain the white light quantum dot complex particle as shown in FIG. 1.

In the example, the weight ratio of the seed particle and the green light quantum dot is 10:1.

EXAMPLE 12

Process for Preparing White Light Quantum Dot Complex Particle (1) dispersing 1 g silicon dioxide nanoparticle with a diameter of 10 nm in 19 g water and dispersing the particle thoroughly with ultrasound to obtain a seed suspension with a weight percentage of 5%;

(2) mixing 0.08 g blue light quantum dot, 0.2 g methacryloyloxypropyltrimethoxysilane, 0.5 g surfactant sodium dodecyl sulfate, 0.1 g 0.5% by weight percent of an ammonium persulfate aqueous solution as an initiator and 99.12 g water for ultrasound emulsification to obtain the emulsion system A; wherein the weight percentage of the monomer in the emulsion system is 0.2%, the weight percentage of the initiator to the weight of the monomer is 0.5%, the weight percentage of the surfactant in the emulsion system is 0.5%, and the weight percentage of the blue light quantum dot in the emulsion system is 0.08%;

mixing 0.1 g red light quantum dot, 0.2 g methacryloyloxypropyltrimethoxysilane, 0.5 g surfactant sodium dodecyl sulfate, 0.1 g 0.5% by weight percent of an ammonium persulfate aqueous solution as an initiator and 99.1 g water for ultrasound emulsification to obtain the emulsion system A; wherein the weight percentage of the monomer in the emulsion system is 0.2%, the weight percentage of the initiator to the weight of the monomer is 0.5%, the weight percentage of the surfactant in the emulsion system is 0.5%, and the weight percentage of the red light quantum dot in the emulsion system is 0.1%; and mixing 0.1 g green light quantum dot, 0.2 g methacryloyloxypropyltrimethoxysilane, 0.5 g surfactant sodium dodecyl sulfate, 0.1 g 0.5% by weight percent of an ammonium persulfate aqueous solution as an initiator and 99.1 g water for ultrasound emulsification to obtain the emulsion system A; wherein the weight percentage of the monomer in the emulsion system is 0.2%, the weight percentage of the initiator to the weight of the monomer is 0.5%, the weight percentage of the surfactant in the emulsion system is 0.5%, and the weight percentage of the green light quantum dot in the emulsion system is 0.1%;

(3) heating the aforesaid seed suspension to 80□, followed by dripping the aforesaid emulsion system A with a dripping rate of 0.1 ml/min; after the conclusion of the dripping, keeping the temperature constant for 2 hours, then starting dripping the aforesaid emulsion system B with a dripping rate of 0.1 ml/min; after the conclusion of the dripping, keeping the temperature constant for 2 hours, then starting dripping the aforesaid emulsion system C with a dripping rate of 0.1 ml/min; after the conclusion of the dripping, keeping the temperature constant for 2 hours.

(4) after the conclusion of the reaction, centrifuging and washing the product with ethanol/water, to obtain the white light quantum dot complex particle as shown in FIG. 1.

In the example, the weight ratio of the seed particle and the green light quantum dot is 10:1.

The aforesaid are merely exemplary embodiments of the invention, rather than limit the scope of the invention which is determined by the appended claims.

The invention claimed is:

1. A white light quantum dot complex particle, comprising a seed particle in a core, and a first shell layer, a second shell layer and a third shell layer wrapped around the seed particle in order,
   wherein in the first shell layer, the second shell layer and the third shell layer are respectively one of a red light quantum dot layer, a green light quantum dot layer and a blue light quantum dot layer, and are different from one another;
   wherein the seed particle has a particle size of 10-500 nm, and a range of a thickness of the first shell layer, the second shell layer and the third shell layer is 5-50 nm;
   a ratio of amounts of the red light, green light and blue light quantum dots in the complex particle is 0.5~0.8:1:1.2~1.5;
   the red light quantum dots comprise CdSe quantum dots with an emission wavelength of 600~700 nm; the green light quantum dots comprise CdSe quantum dots with an emission wavelength of 490~570 nm; and the blue light quantum dots comprise CdSe quantum dots with an emission wavelength of 430~460 nm.

2. The white light quantum dot complex particle according to claim 1, wherein the seed particle is a silicon dioxide nanoparticle, an $Al_2O_3$ nanoparticle or a ZnO nanoparticle.

3. The white light quantum dot complex particle according to claim 1, wherein the seed particle is a silicon dioxide nanoparticle having its surface modified with polymerizable double bonds.

4. The white light quantum dot complex particle according to claim 1, wherein the seed particle has a particle size of 20-50 nm; and a range of a thickness of the first shell layer, the second shell layer and the third shell layer is 10-20 nm.

5. The white light quantum dot complex particle according to claim 1, wherein the ratio of amount of the red light, green light and blue light quantum dots in the complex particle is 0.65~0.74:1:1.25~1.35.

6. The white light quantum dot complex particle according to claim 1, wherein the red light quantum dots comprise CdSe quantum dots with an emission wavelength of 613 nm; the green light quantum dots comprise CdSe quantum dots with an emission wavelength of 555 nm; and the blue light quantum dots comprise CdSe quantum dots with an emission wavelength of 452 nm.

7. A process for preparing a white light quantum dot complex particle according to claim 1, comprising:
   dispersing a seed particle in water to obtain a seed suspension;
   mixing red light quantum dots, green light quantum dots and blue light quantum dots with a monomer, an initiator, a surfactant and water, respectively, for emulsification to obtain three emulsion systems respectively, which are designated as the emulsion system A, the emulsion system B and the emulsion system C, respectively;
   heating the seed suspension to 60-90° C., to which the emulsion system A is dripped, and then reacting with constant temperature for 2-10 h; then dripping the emulsion system B into the seed suspension, and then reacting with constant temperature for 2-10 h; then dripping the emulsion system C into the seed suspension, and then reacting with constant temperature for 2-10 h, to form the first shell layer, second shell layer and third shell layer in order; and
   washing the product after conclusion of the reaction to obtain the white light quantum dot complex particle.

8. The preparative process according to claim 7, wherein a weight percent concentration of the seed particle in the seed suspension is 5-8%.

9. The preparative process according to claim 8, wherein the weight percent concentration of the seed particle in the seed suspension is 5.5-7%.

10. The preparative process according to claim 7, wherein the monomer is at least one of the alkenes having a total of 4-24 carbon atoms, and a weight percentage of the monomer in each emulsion system is 0.1-20%.

11. The preparative process according to claim 10, wherein the monomer is styrene, and the weight percentage of the monomer in each emulsion system is 0.2-10%.

12. The preparative process according to claim 7, wherein the initiator is at least one of potassium persulfate, ammonium persulfate, sodium persulfate or hydrogen peroxide, and a weight percentage of the initiator is 0.1%-8% by weight of the monomer.

13. The preparative process according to claim 12, wherein the initiator is at least one of potassium persulfate, ammonium persulfate, sodium persulfate or hydrogen peroxide, and a weight percentage of the initiator is 0.5%-4% by weight of the monomer.

14. The preparative process according to claim 7, wherein the surfactant is at least one of sodium dodecyl sulfate, sodium dodecyl sulfonate or cetyltrimethylammonium bromide, and a weight percentage of the surfactant in each emulsion system is 0.1-10%.

15. The preparative process according to claim 14, wherein the surfactant is sodium dodecyl sulfate, sodium dodecyl sulfonate or cetyltrimethylammonium bromide, and a weight percentage of the surfactant in each emulsion system is 0.5-5%.

16. The preparative process according to claim 7, wherein a weight percentage of the red light quantum dots, the blue light quantum dots and the green light quantum dots in each emulsion system is 0.08-12%.

17. The preparative process according to claim 7, wherein a weight ratio between the seed particle and the green light quantum dots is 10-12.5:1.

18. The preparative process according to claim 7, wherein a rate for dripping each emulsion system is 0.01-5ml/min.

19. The preparative process according to claim 18, wherein a rate for dripping each emulsion system is 0.1-0.5ml/min.

* * * * *